US008552896B2

(12) United States Patent
Kopa

(10) Patent No.: US 8,552,896 B2
(45) Date of Patent: Oct. 8, 2013

(54) DIGITAL TO ANALOG CONVERTER (DAC)

(75) Inventor: Anthony Kopa, Somerville, MA (US)

(73) Assignee: Raytheon Company, Waltham, MA (US)

( * ) Notice: Subject to any disclaimer, the term of this patent is extended or adjusted under 35 U.S.C. 154(b) by 40 days.

(21) Appl. No.: 13/280,473

(22) Filed: Oct. 25, 2011

(65) Prior Publication Data
US 2013/0099951 A1 Apr. 25, 2013

(51) Int. Cl.
H03M 1/66 (2006.01)
(52) U.S. Cl.
USPC ......... 341/144; 341/143; 341/145; 330/124 R
(58) Field of Classification Search
USPC ................ 341/144–154; 330/124 R
See application file for complete search history.

(56) References Cited

U.S. PATENT DOCUMENTS

| | | | | |
|---|---|---|---|---|
| 5,684,482 A * | 11/1997 | Galton | | 341/144 |
| 6,344,812 B1 * | 2/2002 | Takeda et al. | | 341/143 |
| 6,614,377 B1 * | 9/2003 | Adams et al. | | 341/144 |
| 7,123,178 B2 * | 10/2006 | Ishizuka et al. | | 341/144 |
| 7,304,593 B2 * | 12/2007 | Luecking et al. | | 341/143 |
| 7,308,039 B2 * | 12/2007 | Chan | | 375/295 |
| 7,321,328 B1 * | 1/2008 | Sutton | | 341/152 |
| 7,501,969 B2 * | 3/2009 | Schoner | | 341/144 |
| 7,599,447 B2 * | 10/2009 | Chan | | 375/295 |
| 7,898,447 B2 * | 3/2011 | Goshima et al. | | 341/120 |
| 8,022,850 B2 * | 9/2011 | Newman | | 341/144 |
| 8,098,718 B2 * | 1/2012 | Sienko et al. | | 375/216 |
| 8,154,432 B2 | 4/2012 | Kaper | | |
| 8,180,304 B2 * | 5/2012 | Ma et al. | | 455/114.3 |
| 2003/0156051 A1 * | 8/2003 | Brooks et al. | | 341/143 |
| 2004/0104830 A1 * | 6/2004 | May | | 341/144 |
| 2008/0290938 A1 * | 11/2008 | Gupta et al. | | 330/127 |

OTHER PUBLICATIONS

Colantonio, et al. The Doherty Power Amplifier, Advanced 108 Microwave Circuits and Systems, Apr. 2010.
Joeng et al., A Novel Power Combining Network for a Doherty Amplifier, Microwave Journal, Jul. 2004.

* cited by examiner

Primary Examiner — Linh Nguyen
(74) Attorney, Agent, or Firm — Daly, Crowley, Mofford & Durkee, LLP

(57) ABSTRACT

A DAC for converting a sequence of digital words into a corresponding analog signal. The DAC includes: a thermometer code generator fed by the sequence of digital words for providing N parallel outputs, each one of the outputs having one of two discrete levels; and an amplifier section having a plurality of N amplifiers, each one of the N amplifiers being fed by a different one of the M outputs. Each one of the amplifiers is driven into saturation in response to one of the two discrete levels or pinched-off in response to the other one of the two discrete levels. A combiner sums outputs of the N amplifiers producing a sequence of analog signals having levels related to the decimal values of the sequence of the digital words. An interconnection network interleaves connections between the thermometer code generator and the plurality of amplifier sections.

6 Claims, 5 Drawing Sheets

DIGITAL TO ANALOG CONVERTER (DAC)

TECHNICAL FIELD

This disclosure relates generally to digital-to-analog converters (DACs) and more particularly to digital to analog converters that directly synthesize high power analog signals at radio and microwave frequencies with high DC-to-RF power conversion efficiency.

BACKGROUND AND SUMMARY

As is known in the art, digital-to-analog converters have a wide range of applications. It is describable in some applications to produce a high power analog signal corresponding to a digital word. More particularly, in some applications it is desirable to provide a digital to analog converter that directly synthesizes high power analog signals at radio and microwave frequencies with high DC-to-RF power conversion efficiency. Further it would be desirable to provide such a digital to analog converter that may be used to accept a digital input and directly drive an antenna or other RF load without the need for additional power amplification (i.e. a software defined radio transmitter).

In accordance with one embodiment of the disclosure, a digital to analog converter is provided having: a source of a sequence of digital words, each one of the words having a decimal value n, where n is a decimal value between 0 and N; a thermometer code generator fed by the sequence of digital words for providing N parallel outputs, each one of the outputs having one of two discrete levels, the number of the outputs having the same one of the two discrete levels being a function of the decimal value n; an amplifier section having a plurality of N amplifiers, each one of the M amplifiers being fed by a different one of the N outputs of the thermometer code generator, each one of the amplifiers being driven into saturation in response to one of the two discrete levels or pinched-off in response to the other one of the two discrete levels; and a combiner for summing outputs of the N amplifiers producing a sequence of analog signals having levels related to the decimal values of the sequence of the digital words.

In one embodiment, the number of the outputs having a first one of the two discrete levels is a function of the decimal value n; and wherein each one of the amplifiers is driven into saturation in response to the first one of the two discrete levels.

In one embodiment, the digital words are produced with a predetermined pulse repetition frequency and wherein the sequence of analog signals is produced at said predetermined pulse repetition frequency.

In one embodiment, each one of the N outputs is a train of pulses.

In one embodiment, the amplifier section comprises a multi-input load-modulation amplifier.

In one embodiment, each one of the N outputs is a return-to-zero signal.

In one embodiment, a digital to analog converter is provided, comprising: a source of a digital word having a decimal value n, where n is a decimal value between 0 and N; a thermometer code generator fed by the digital word for providing N parallel outputs $m_1$-$m_N$, each one of the outputs having one of two discrete levels, the number of the N parallel outputs having the same one of the two discrete levels being a function of the decimal value n, the outputs $m_1$-$m_N$ having said same one of the two discrete levels successively increasing with increasing decimal value n; and a plurality of amplifier sections. Each one of the amplifier sections comprises: a plurality of amplifiers; and a power combiner fed by outputs of the plurality of amplifiers. The digital to analog converter includes: a interconnection network for interleaving connections between the thermometer code generator and the plurality of amplifier sections; and a combiner for summing outputs of the power combiner of each one of the plurality of amplifier sections producing a sequence of analog signals having levels related to the decimal values of the sequence of the digital words.

In one embodiment, a digital to analog converter is provided, comprising: a source of a sequence of digital words, each one of the words having a decimal value n, where n is a decimal value between 0 and N; a thermometer code generator fed by the sequence of digital words for providing N parallel outputs $m_1$-$m_N$, each one of the outputs having one of two discrete levels, the number of the N parallel outputs having the same one of the two discrete levels being a function of the decimal value n, the outputs $m_1$-$m_N$ having said same one of the two discrete levels successively increasing with successively increasing decimal value n; and a plurality of P multi-input load-modulation amplifier sections, $A_P$, where p is an integer from 1 through P. Each one of the multi-input load-modulation amplifier sections, $A_p$, comprises: a plurality of N/P amplifiers coupled to the thermometer code generator; and a load-modulation network fed by outputs of the plurality of N/P amplifiers. Each one of the amplifier section $A_P$ is fed outputs $m_p$, $M_{p+P}$, $m_{p+2P}$ …. Each one of the amplifiers is driven into saturation in response to one of the two discrete levels or pinched-off in response to the other one of the two discrete levels. The digital to analog converter includes a combiner for summing outputs of each one of the plurality of P multi-input load-modulation amplifier sections producing a sequence of analog signals having levels related to the decimal values of the sequence of the digital words.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1:
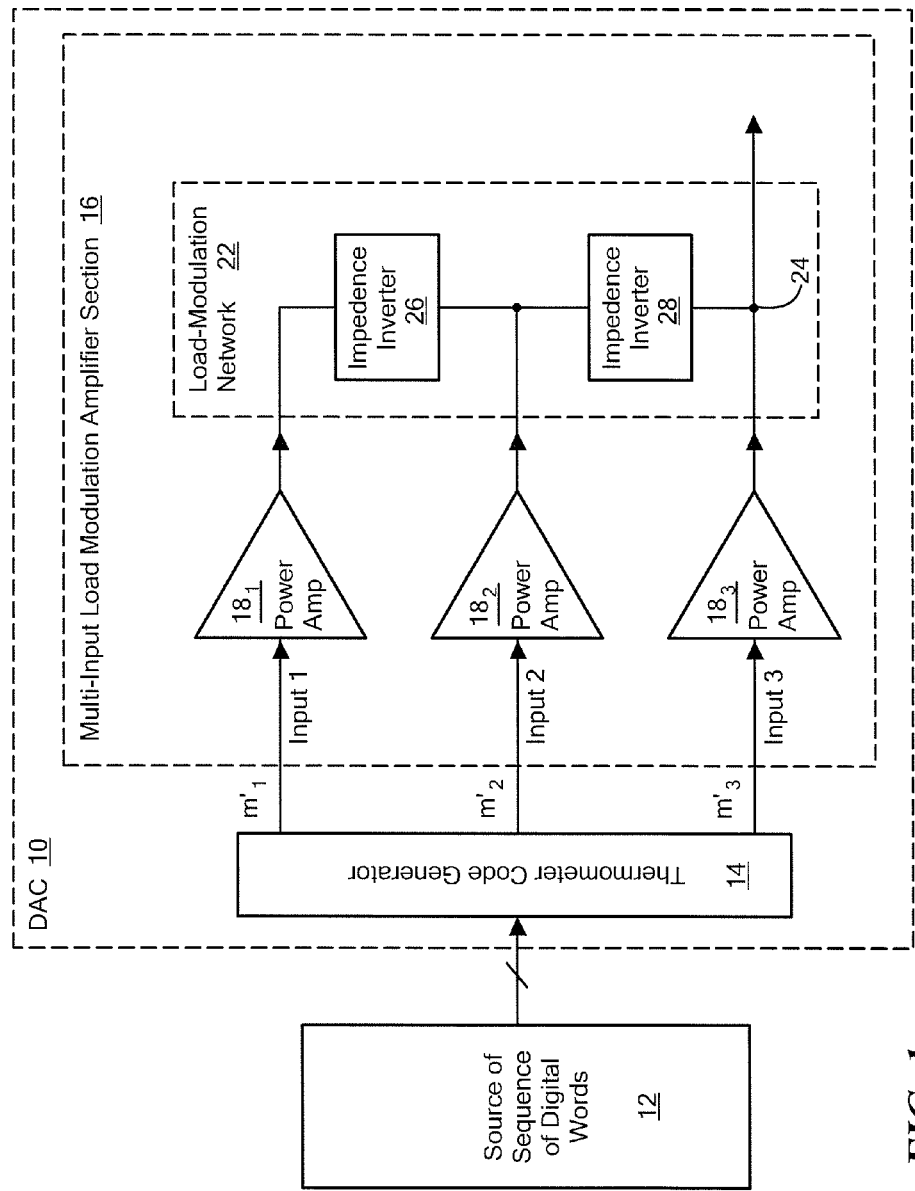
FIG. 1 is a block diagram of a digital to analog converter according to one embodiment of the disclosure.

Referring now to FIG. 1, a digital to analog converter 10 is shown fed by a source 12 of a sequence of digital words, each one of the words having a decimal value n, where n is a decimal value between 0 and N. Here, the digital words are produced sequentially at a rate f. The converter 10 includes a thermometer code generator 14 fed by the sequence of digital words for providing N, here for example, 3, parallel outputs, m'$_1$ through m'$_3$, respectively (herein also labeled as inputs INPUT 1-INPUT 3, respectively), of a multi-input load-modulation amplifier section 16. Each one of the outputs of the thermometer code generator 14 has one of two discrete levels, (here either a return-to-zero (RZ) pulse or the absence of such a pulse). The number of the outputs having the same one of the two discrete levels being a function of the decimal value n.

Thus, as shown in the table below, in response to a digital word having a decimal value of 0, all three inputs INPUT1-INPUT3 have a RZ logic state of zero (0); in response to a digital word having a decimal value of 1, only INPUT1 has a RZ logic state of 1, INPUT2-INPUT3 having a RZ logic state of 0; in response to a digital word having a decimal value of 2, only INPUT1 and INPUT 2 have a RZ logic state of 1, INPUT3 having a RZ logic state of 0; in response to a digital word having a decimal value of 3, all INPUT1-INPUT3 have a RZ logic state of 1:

| DIGITAL WORD DECIMAL VALUE | INPUT 1 | INPUT 2 | INPUT 3 | OUTPUT VOLTAGE (V) |
|---|---|---|---|---|
| 0 | RZ State 0 | RZ State 0 | RZ State 0 | 0 |
| 1 | RZ state 1 | RZ State 0 | RZ State 0 | 1 LSB (e.g, 1 V) |
| 2 | RZ State 1 | RZ State 1 | RZ State 0 | 2 LSB (e.g. 2 V) |
| 3 | RZ state 1 | RZ State 1 | RZ State 1 | 3 LSB (= Full Scale, e.g., 3 V)) |

*Least Significant Bit for summing outputs of the M amplifiers 18$_1$-18$_3$ producing a sequence of analog signals having levels related to the decimal values of the sequence of the digital words. More particularly, the output of amplifier 18$_1$ is fed to a summing node 24 through an impedance inverter 26 and an impedance inverter 28, as shown; the output of amplifier 18$_2$ is coupled to summing node 24 through the impedance inverter 28; and the output of amplifier 18$_3$ is coupled to the summing node 24, as shown. The load-modulation network 22 may be, for example, similar to one used in a Doherty amplifier.

Figure 2:
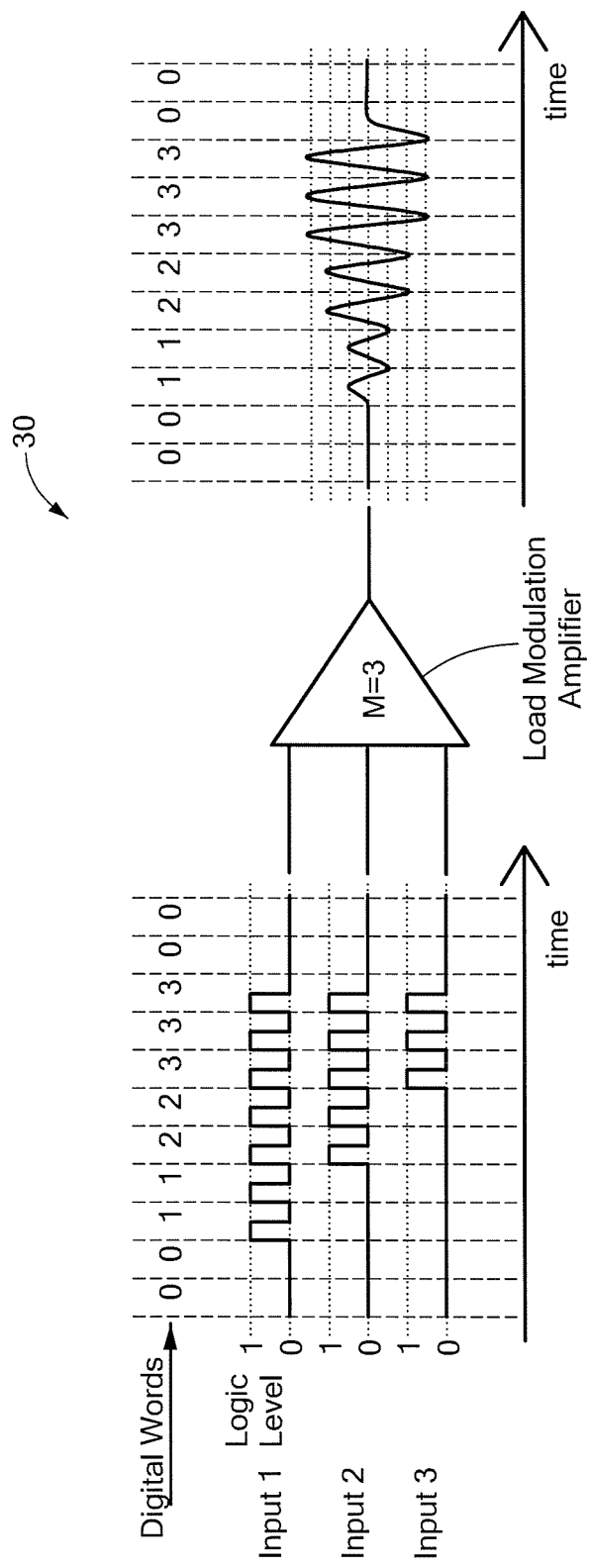
FIG. 2 is a sketch showing the output of digital to analog converter of FIG. 1 in response to a source of digital words fed to the digital to analog converter of FIG. 1.

Referring now to FIG. 2, an example of the analog output 30 of the multi-input load-modulation amplifier section 16 is shown where the sequence of digital words is: 0, 0, 1, 1, 2, 2, 3, 3, 0, 0.

Figure 3:
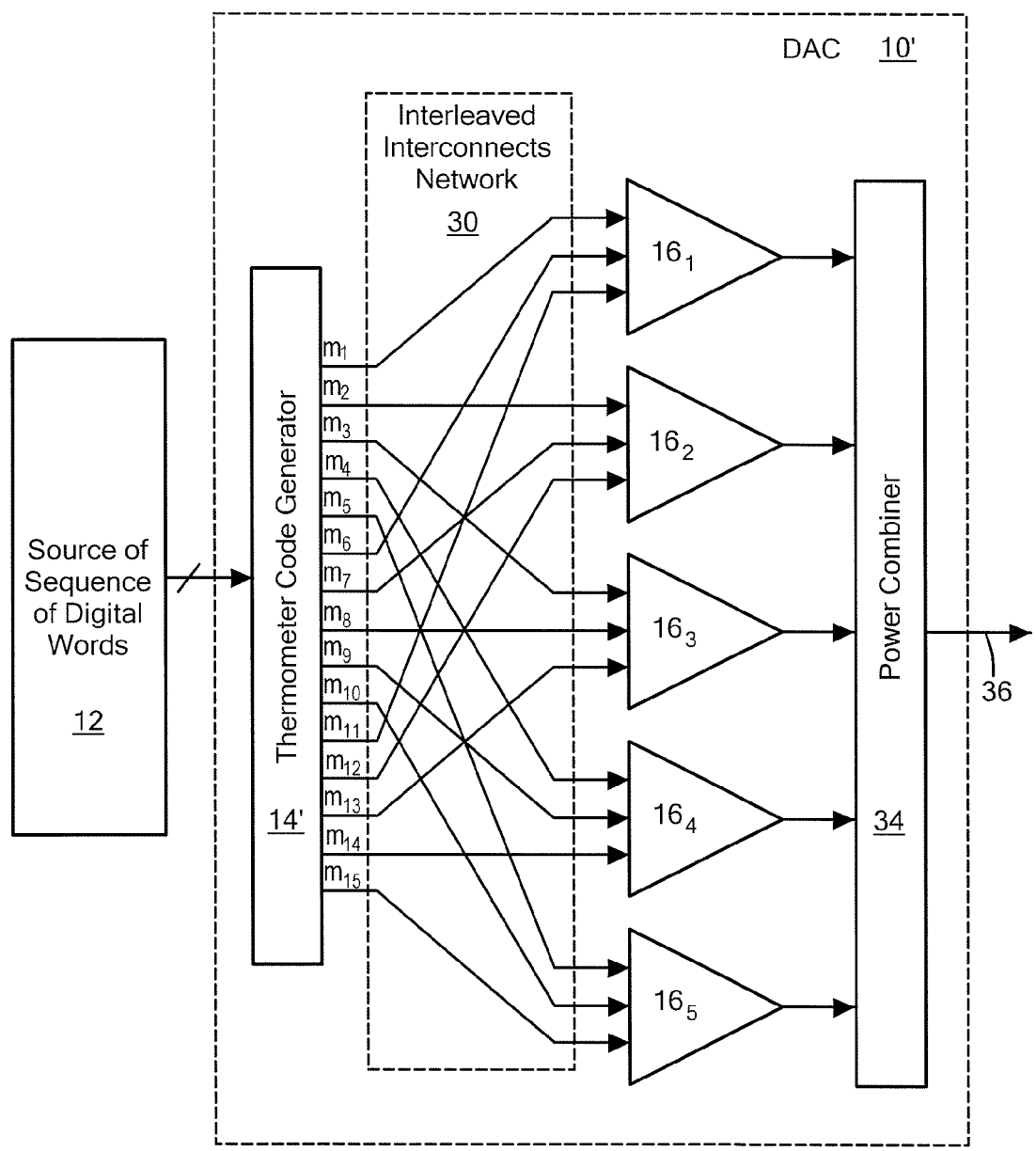
FIG. 3 is a block diagram of a digital to analog converter according to another embodiment of the disclosure.

Referring now to FIG. 3, a digital to analog converter 10', comprising: the source 12 of a sequence of digital words having a decimal value n, where n is a decimal value between 0 and N. where here, in this example, N=15 and the thermometer code generator 14' fed by the digital words for providing N parallel outputs m$_1$-m$_N$. Here again, as with the thermometer code generator 14, each one of the outputs m$_1$-m$_N$ has one of two discrete levels, (here one of two return to zero (RZ) pulse levels), the number of the N parallel outputs having the same one of the two discrete levels being a function of the decimal value n. The outputs m$_1$-m$_N$ having said same one of the two discrete levels successively increasing with increasing decimal value n, as indicated in the table below:

| DIGITAL WORD DECIMAL VALUE | m1 | m2 | m3 | m4 | m5 | m6 | m7 | m8 | m9 | m10 | m11 | m12 | m13 | m14 | m15 | OUTPUT VOLTAGE (V) |
|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0LSB |
| 1 | 1 | 0 | 0 | 0 | 0 | 0 | 0 | 0 | 0 | 0 | 0 | 0 | 0 | 0 | 0 | 1LSB |
| 2 | 1 | 1 | 0 | 0 | 0 | 0 | 0 | 0 | 0 | 0 | 0 | 0 | 0 | 0 | 0 | 2LSB |
| 3 | 1 | 1 | 1 | 0 | 0 | 0 | 0 | 0 | 0 | 0 | 0 | 0 | 0 | 0 | 0 | 3LSB |
| 4 | 1 | 1 | 1 | 1 | 0 | 0 | 0 | 0 | 0 | 0 | 0 | 0 | 0 | 0 | 0 | 4LSB |
| 5 | 1 | 1 | 1 | 1 | 1 | 0 | 0 | 0 | 0 | 0 | 0 | 0 | 0 | 0 | 0 | 5LSB |
| 6 | 1 | 1 | 1 | 1 | 1 | 1 | 0 | 0 | 0 | 0 | 0 | 0 | 0 | 0 | 0 | 6LSB |
| 7 | 1 | 1 | 1 | 1 | 1 | 1 | 1 | 0 | 0 | 0 | 0 | 0 | 0 | 0 | 0 | 7LSB |
| 8 | 1 | 1 | 1 | 1 | 1 | 1 | 1 | 1 | 0 | 0 | 0 | 0 | 0 | 0 | 0 | 8LSB |
| 9 | 1 | 1 | 1 | 1 | 1 | 1 | 1 | 1 | 1 | 0 | 0 | 0 | 0 | 0 | 0 | 9LSB |
| 10 | 1 | 1 | 1 | 1 | 1 | 1 | 1 | 1 | 1 | 1 | 0 | 0 | 0 | 0 | 0 | 10LSB |
| 11 | 1 | 1 | 1 | 1 | 1 | 1 | 1 | 1 | 1 | 1 | 1 | 0 | 0 | 0 | 0 | 11LSB |
| 12 | 1 | 1 | 1 | 1 | 1 | 1 | 1 | 1 | 1 | 1 | 1 | 1 | 0 | 0 | 0 | 12LSB |
| 13 | 1 | 1 | 1 | 1 | 1 | 1 | 1 | 1 | 1 | 1 | 1 | 1 | 1 | 0 | 0 | 13LSB |
| 14 | 1 | 1 | 1 | 1 | 1 | 1 | 1 | 1 | 1 | 1 | 1 | 1 | 1 | 1 | 0 | 14LSB |
| 15 | 1 | 1 | 1 | 1 | 1 | 1 | 1 | 1 | 1 | 1 | 1 | 1 | 1 | 1 | 1 | 15LSB |

Figure 1A:
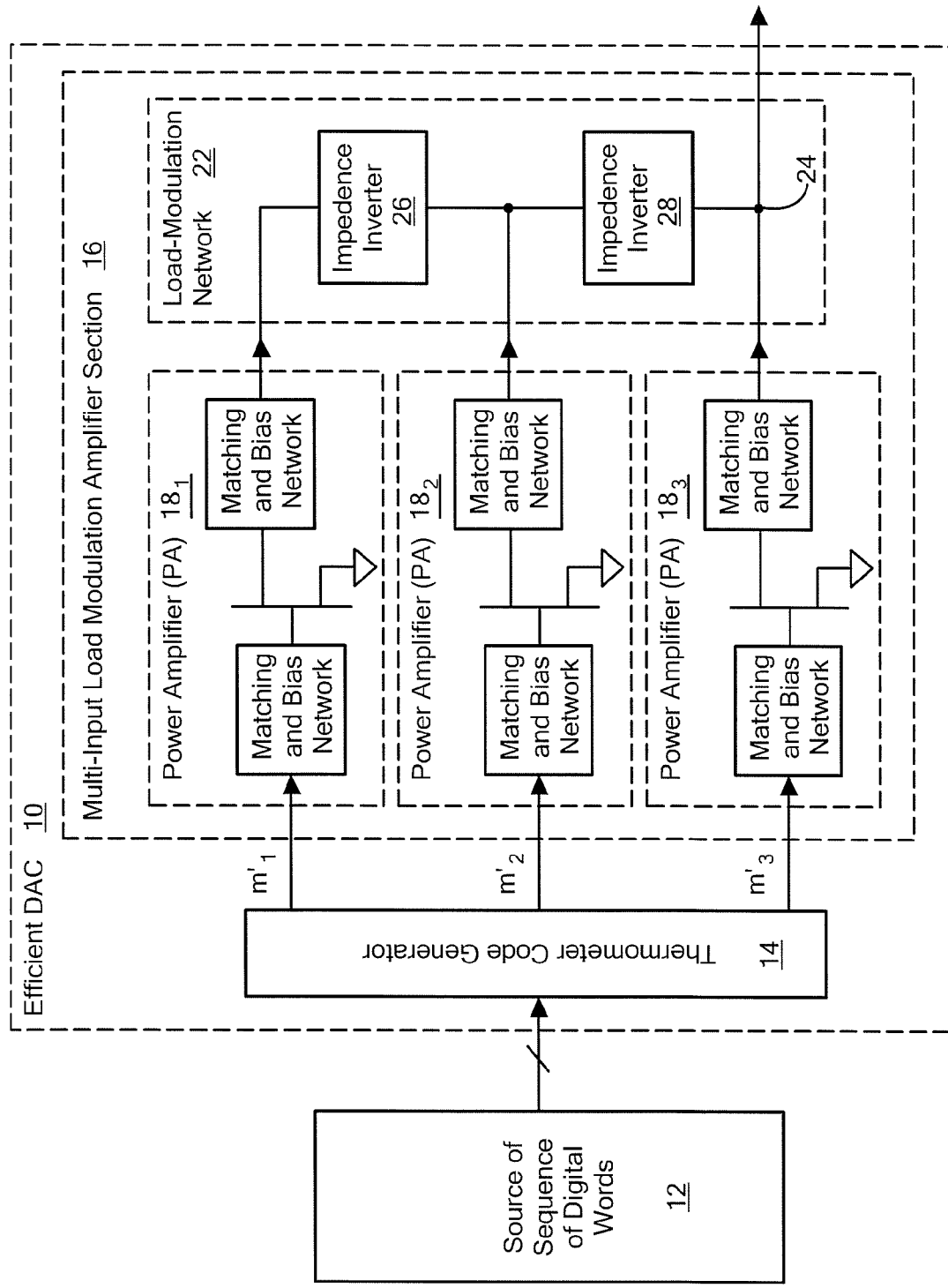
FIG. 1A is a more detailed block diagram of a digital to analog converter of FIG. 1

Referring again to FIG. 1 and also to FIG. 1A), the amplifier section 16 includes a plurality of N FET power amplifiers (PAs) 18$_1$-18$_3$, (FIG. 1A). Each one of the N power amplifiers 18$_1$-18$_3$ is fed by a different one of the N outputs of the thermometer code generator (i.e., INPUTS1-INPUT3, respectively), as shown. Each one of the amplifiers 18$_1$-18$_3$ is here a power FET amplifier and is biased to be driven into saturation in response to one of the two discrete RZ levels; here RZ state 1, or pinched-off in response to the other one of the two discrete RZ levels; here RZ state 0. The outputs of the amplifiers 18$_1$-18$_3$ are fed to the load-modulation network 22

The outputs m$_0$-m$_{15}$ are fed to a plurality of, here in this example 5, of the multi-input load-modulation amplifier sections 16 described above in connection with FIG. 1, here indicated as multi-input amplifier sections 16$_1$-16$_5$. As noted above in connection with FIGS. 1 and 1A, each one of the amplifier sections 16 comprises: a plurality of FET amplifiers 18$_1$-18$_3$ and a load-modulation network 22 fed by outputs of the plurality of amplifiers 18$_1$-18$_3$.

Figure 4:
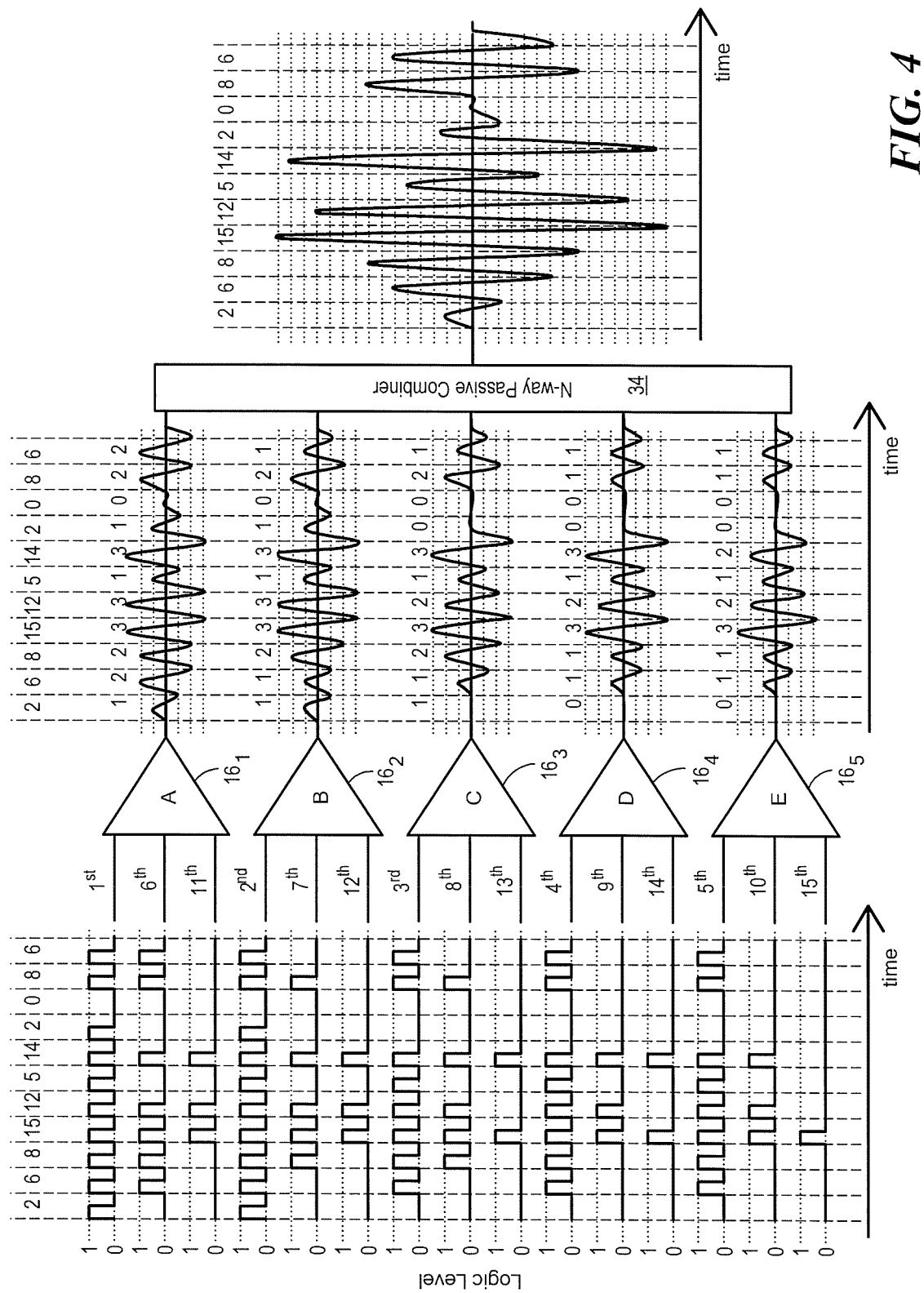
FIG. 4 is a sketch showing the output of digital to analog converter of FIG. 3 in response to a source of digital words fed to the digital to analog converter of FIG. 4.

Here, an interconnection network 30 (FIG. 3) is provided for interleaving connections between the thermometer code generator 14' and the plurality of amplifiers sections 16$_1$-16$_5$, as indicated in FIG. 4 along with a power combiner 34 for summing outputs of the plurality of amplifiers sections $16_1$-$16_5$, more particularly for summing the outputs of the load-modulation networks 22 (FIGS. 1 and 1A) of each one of the plurality of multi-input amplifier sections $16_1$-$16_5$ producing a sequence of analog signals at output 36 (FIG. 3) having levels related to the decimal values of the sequence of the digital words. It is noted that the combiner 34 is here an isolated combiner (e.g. a Wilkinson Combiner).

Thus, referring also to FIG. 3, it is noted that:
amplifier section $16_1$ is fed by outputs $m_1$, $m_6$, $m_{11}$;
amplifier section $16_2$ is fed by outputs $m_2$, $m_7$, $m_{12}$;
amplifier section $16_3$ is fed by outputs $m_3$, $m_8$, $m_{13}$;
amplifier section $16_4$ is fed by outputs $m_4$, $m_9$, $m_{14}$; and
amplifier section $16_5$ is fed by outputs $m_5$, $m_{10}$, $m_{15}$.

Thus, in the more general case, with: a source of a sequence of digital words, each one of the words having a decimal value n, where n is a decimal value between 0 and N; and a thermometer code generator fed by the sequence of digital words for providing N parallel outputs $m_1$-$m_N$, each one of the outputs having one of two discrete levels, the number of the N parallel outputs having the same one of the two discrete levels being a function of the decimal value n, the outputs $m_1$-$m_N$ having said same one of the two discrete levels successively increasing with successively increasing decimal value n; and with a plurality of P amplifier sections, $A_P$, where p is an integer from 1 through P, (in the example above p=5) each one of the amplifier sections, $A_p$, will comprise:

a plurality of N/P amplifiers coupled to the thermometer code generator; and
a load-modulation network fed by outputs of the plurality of N/P amplifiers;
wherein amplifier section $A_p$ is fed outputs $m_p$, $m_{p+P}$, $m_{p+2P}$ . . . ; and
wherein each one of the amplifiers is driven into saturation in response to one of the two discrete levels or pinched-off in response to the other one of the two discrete levels; and
the combiner will sum outputs of each one of the load-modulation networks of the plurality of P multi-input load-modulation amplifier sections producing a sequence of analog signals having levels related to the decimal values of the sequence of the digital words.

An example is shown in FIG. 4 where the sequence of digital worse is: 2, 6, 8, 15, 12, 5, 14, 2, 0, 8, 6.

Having described several embodiments of the disclosure, the following should be noted:

There are three key ways efficiency is reduced in a conventional DAC and the embodiments described above reduce this loss of efficiency:

Condition 1: Waveform at the FET amplifier—the FET amplifier has to switch on and off in a way that is efficient (this is typical for RF power amps, but not typical for DACs). In this context a power amplifier should be assumed to have a single FET that switches efficiently. The load modulation network described above is used to ensure multiple FET amplifiers switch efficiently no matter how many FET amplifiers are driven at the same time. The conditions for this to be true is that the thermometer code is used (i.e., drive either FET amplifier $18_1$); or FET amplifiers $18_1$ and $18_2$; or FET amplifiers $18_1$ and $18_2$ and $18_3$; combinations FET amplifiers $18_1$ and FET amplifier $18_3$; FET amplifier $18_2$ and FET amplifier $18_3$; just FET amplifier $18_2$, and just FET amplifier $18_3$—are not allowed.

Condition 2: Loss after the FET amplifier—RF power is generated at the FET amplifier. If any of that power is lost in the DAC after the FET amplifier, the power loss directly subtracts from efficiency.

Condition 3: Isolated Combiner 36 Imbalance—a typical use of an isolated combiner 36 (like the Wilkinson Combiner) is to combine an equal amount of power from several amplifier sections $16_1$-$16_N$. If each input to the combiner 36 is not driven exactly equally, then some RF power is dissipated in the combiner.

Balancing these three conditions is accomplished by the discoursed embodiments.

Consider several extreme cases:

Case A) The use of 15 or more FET amplifiers in an multi-input load-modulation amplifier section would satisfy condition 1, but would violate condition 2 requiring for example, 14 pieces of quarter-wave line in series, with impedances spanning a factor of $2^{13}$. Such an arrangement may not be physically realizable. Furthermore, 15 is an arbitrary number used in this example to keep the schematics readable as applications requiring more than 15 are useful in many applications.

Case B) The use of a 15-way (or larger) isolated combiner without any load-modulation networks preserves Condition 1 because each of the 15 amplifiers is isolated from the others and will switch efficiency regardless of what the other amps are doing. Condition 2 can be reasonably assumed because in the 15-way isolated combiner the 15 pieces of transmission lines are not connected in series (as in the load-modulation network) and all have the same (moderate) impedance. However, Condition 3 is violated when a small number of amplifiers are driven and the rest are off. In that case the isolated combiner dissipates a significant amount of RF power due to imbalance. This case does not need any particular coding scheme—because of symmetry each amplifier is indistinguishable.

Applicant has recognized that using a 3-way load-modulation network with reasonably low loss can reduce the size of the isolated combiner by a factor of 3—from 15 inputs down to 5 inputs. Now, consider the digital input is the number 10 (ten). With a DAC according to the disclosure, all 5 inputs of the isolated combiner with 2LSB will preserve Condition 3 because all the inputs are equal. In case B 10 inputs driven with 1LSB and 5 inputs un-driven (0) will violate Condition 3.

A number of embodiments of the disclosure have been described. Nevertheless, it will be understood that various modifications may be made without departing from the spirit and scope of the disclosure. For example, while FET amplifiers have been described other active devices may be used. Accordingly, other embodiments are within the scope of the following claims.

What is claimed is:

1. A digital to analog converter, comprising:
a source of a digital word having a decimal value n, where n is a decimal value between 0 and N;
a thermometer code generator fed by the digital word for providing N parallel outputs $m_1$-$m_N$, each one of the outputs having one of two discrete levels, the number of the N parallel outputs having the same one of the two discrete levels being a function of the decimal value n, the outputs $m_1$-$m_N$ having said same one of the two discrete levels successively increasing with increasing decimal value n;
a plurality of multi-input load modulation amplifier sections, each one of the multi-input load modulation amplifier sections comprising:

a plurality of amplifiers; and a load modulation network fed by outputs of the plurality of amplifiers;

a interconnection network for interleaving connections between the thermometer code generator and the plurality of amplifier sections; and a combiner for summing outputs of the load modulation network of each one of the plurality of multi-input load modulation amplifier sections producing a sequence of analog signals having levels related to the decimal values of the sequence of the digital words.

2. The digital to analog converter recited in claim 1 wherein the load modulation section comprises a plurality of interconnected impedance transforming devices.

3. The digital to analog converter recited in claim 2 wherein the digital words are produced with a predetermined pulse repetition frequency and wherein the sequence of analog signals is produced at said predetermined pulse repetition frequency.

4. The digital to analog converter recited in claim 3 wherein each one of the N outputs is a return to zero signal.

5. A digital to analog converter for converting a sequence of digital words into a corresponding analog signal, comprising:

a thermometer code generator fed by the sequence of digital words for providing N parallel outputs, each one of the outputs having one of two discrete levels;

an amplifier section having a plurality of N amplifiers, each one of the N amplifiers being fed by a different one of the N outputs; and a load modulation network for combing outputs of the plurality of N amplifiers producing a sequence of analog signals having levels related to the decimal values of the sequence of the digital words, including: a plurality of amplifier sections; and an interconnection network for interleaving connections between the thermometer code generator and the plurality of amplifier sections.

6. A digital to analog converter for converting a sequence of digital words into a corresponding analog signal, comprising:

a thermometer code generator fed by the sequence of digital words for providing N parallel outputs, each one of the outputs having one of two discrete levels;

an amplifier section having a plurality of N amplifiers, each one of the N amplifiers being fed by a different one of the N outputs; and a load modulation network for combing outputs of the plurality of N amplifiers producing a sequence of analog signals having levels related to the decimal values of the sequence of the digital words;

wherein the load modulation network comprises a plurality of interconnected impedance transforming devices; and including: a plurality of amplifier sections; and an interconnection network for interleaving connections between the thermometer code generator and the plurality of amplifier sections.

* * * * *